(12) United States Patent
Nimura

(10) Patent No.: US 9,477,015 B2
(45) Date of Patent: Oct. 25, 2016

(54) MICROLENS ARRAY, METHOD FOR MANUFACTURING MICROLENS ARRAY, ELECTRO-OPTICAL DEVICE AND ELECTRONIC APPARATUS

(71) Applicant: Seiko Epson Corporation, Tokyo (JP)

(72) Inventor: Toru Nimura, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/569,702

(22) Filed: Dec. 13, 2014

(65) Prior Publication Data

US 2015/0192705 A1  Jul. 9, 2015

(30) Foreign Application Priority Data

Jan. 9, 2014 (JP) ................. 2014-002194

(51) Int. Cl.
 *G02B 27/10* (2006.01)
 *G02B 3/00* (2006.01)
 *G03B 13/24* (2006.01)
 *G02F 1/1335* (2006.01)
 *H01L 27/146* (2006.01)

(52) U.S. Cl.
 CPC .......... *G02B 3/0043* (2013.01); *G02B 3/0006* (2013.01); *G02B 3/0012* (2013.01); *G02B 3/0056* (2013.01); *G03B 13/24* (2013.01); *G02F 1/133526* (2013.01); *H01L 27/14603* (2013.01); *H01L 27/14627* (2013.01)

(58) Field of Classification Search
 CPC G02B 3/0006; G02B 3/0012; G02B 3/0031; G02B 3/0043; G02B 3/0087; G02B 3/04; G02B 27/2214; G02F 1/133526; H01L 27/14603; H01L 27/14627; H01L 27/14685; H04N 5/2254; H04N 13/0422; G03B 13/24; B29D 11/00153; B29D 11/00365

USPC ............. 359/619, 621–623, 626, 628, 630; 362/602, 606, 607, 610, 615, 621, 622; 250/208.1, 216, 227.28; 396/150, 382; 216/26; 438/69; 348/340, 349; 349/95

See application file for complete search history.

(56) References Cited

U.S. PATENT DOCUMENTS

| | | | | |
|---|---|---|---|---|
| 4,496,216 A * | 1/1985 | Cowan | ...................... | G02B 5/32 359/558 |
| 5,867,321 A * | 2/1999 | Nakama | ............... | G02B 3/0012 359/619 |
| 6,727,965 B1 | 4/2004 | Kubota | | |
| 6,836,619 B2 * | 12/2004 | Ohmura | ................. | G03B 13/24 359/619 |
| 7,764,428 B2 * | 7/2010 | Hayashi | ............... | G02B 3/0043 359/619 |
| 8,792,174 B2 * | 7/2014 | Schmaelzle | ......... | G02B 3/0012 359/619 |
| 9,019,199 B2 * | 4/2015 | Wang | ..................... | G02F 1/167 345/107 |

FOREIGN PATENT DOCUMENTS

| | | |
|---|---|---|
| JP | 2001-075091 A | 3/2001 |
| JP | 2004-309638 A | 11/2004 |
| JP | 2005-352392 A | 12/2005 |
| JP | 2011-158755 A | 8/2011 |

\* cited by examiner

*Primary Examiner* — Loha Ben
(74) *Attorney, Agent, or Firm* — ALG Intellectual Property, LLC

(57) ABSTRACT

A microlens array includes a cell, and P lenses (P is an integer of 4 or more) arranged in the cell, in which the apexes of the P lenses are arranged such that symmetry is at least partially broken, when viewed in plan view. In this way, it is possible to suppress diffraction caused by regularity in the lens shape in the cell. Accordingly, it is possible to realize a microlens with a high utilization efficiency of light.

20 Claims, 10 Drawing Sheets

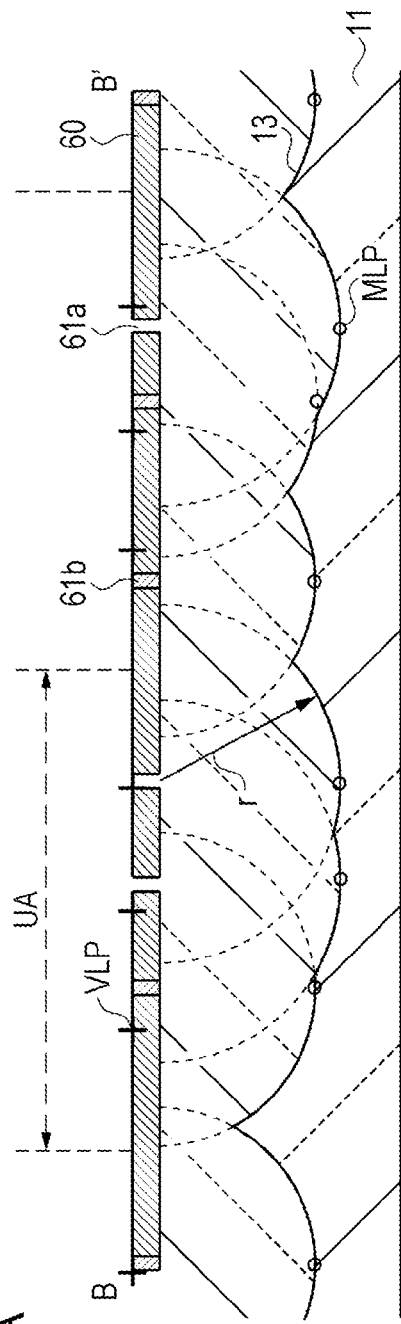
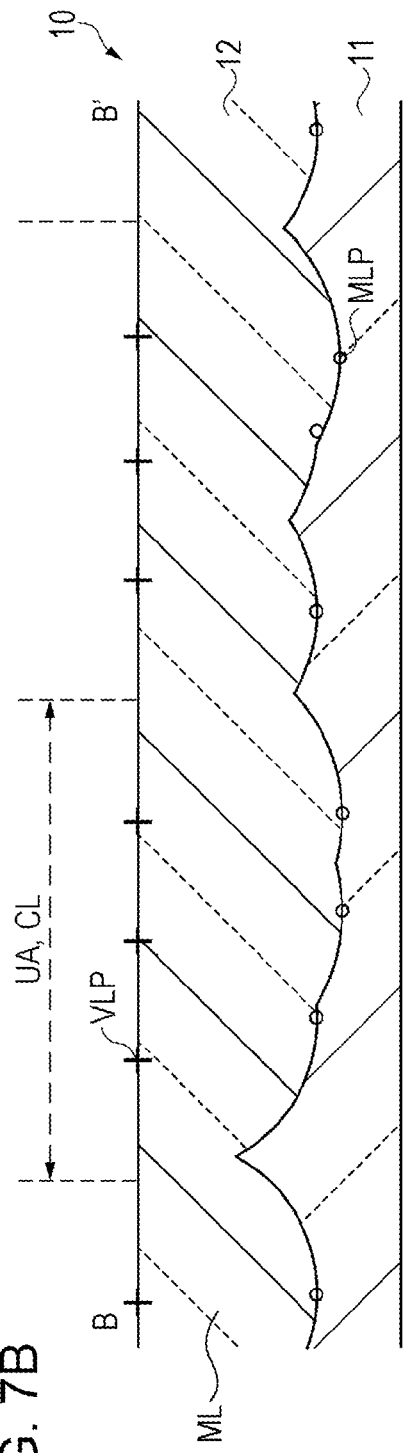
FIG. 7A
FIG. 7B

MICROLENS ARRAY, METHOD FOR MANUFACTURING MICROLENS ARRAY, ELECTRO-OPTICAL DEVICE AND ELECTRONIC APPARATUS

BACKGROUND

1. Technical Field

The present invention relates to a microlens array, a method for manufacturing a microlens array, an electro-optical device, and an electronic apparatus.

2. Related Art

An electro-optical device is known which includes an electro-optical material, such as, a liquid crystal or the like, between an element substrate and a counter substrate. Examples of the electro-optical device include, for example, a liquid crystal device used as a liquid crystal light valve of a projector. There is demand for realizing a high optical utilization efficiency in such a liquid crystal device.

A liquid crystal device is provided with TFT elements that drive pixels, wirings and the like outside a pixel region on an element substrate, and a light blocking layer is provided so as to planarly overlap thereupon. Therefore, a portion of the incident light is blocked by the light blocking layer and not utilized. A configuration is known in which incident light is collected by the microlenses, thereby increasing the utilization efficiency of light, by including a microlens array in which microlenses are arranged on at least one of the element substrate and the counter substrate of a liquid crystal device.

JP-A-2011-158755 discloses a method for reducing the processing load when manufacturing the microlens array. In the configuration in JP-A-2011-158755, once a plurality of lenses is arranged in a pixel, and the size of the plurality of lenses is made a lens pitch of 1/integer, the center of each lens is biased in the center direction of the pixel by a fixed amount.

However, the microlens array disclosed in JP-A-2011-158755 has a problem of a poor utilization efficiency of light. Generally, because pixels are regularly (periodically) arranged in a liquid crystal device including a microlens array, the pixels become smaller as the liquid crystal device becomes increasingly high definition, and incident light is easily diffracted by the pixels. When strong diffracted light occurs, the solid angle of the luminous flux emitted from the liquid crystal device increases. When the liquid crystal device including such a microlens array is used as a liquid crystal light valve in a projector, the spread angle of light emitted from the liquid crystal device may exceed the incident angle that is stipulated by the F value of the projection lens. In this case, a portion of the light emitted from the liquid crystal device is not incident on the projection lens, and, as a result, the amount of light projected on the screen is lowered. Particularly, the problem is serious in the microlens array disclosed in JP-A-2011-158755, and even using a microlens array, there is a limit on the improvement in brightness. In other words, in a microlens array of the related art, a problem arises in that it is difficult to sufficiently improve the utilization efficiency of light.

SUMMARY

The invention can be realized in the following forms or application examples.

APPLICATION EXAMPLE 1

According to this application example, there is provided a microlens array that includes a first lens, a second lens and a third lens arranged in a cell, in which the first lens and the second lens are arranged neighboring in a first direction, and the first lens and the third lens are arranged neighboring in a second direction substantially orthogonal to the first direction, and a gap between an apex of the first lens and an apex of the second lens is different to the gap between the apex of the first lens and an apex of the third lens.

In this case, it is possible to suppress diffraction caused by regularity in the lens shape in the cell. Accordingly, it is possible to realize a microlens with a high utilization efficiency of light.

APPLICATION EXAMPLE 2

According to this application example, there is provided a microlens array that includes a first lens, a second lens and a third lens arranged in a cell, in which the first lens and the second lens are arranged neighboring in a first direction, the first lens and the third lens are arranged neighboring in a second direction substantially orthogonal to the first direction, and an inner product of a vector that connects an apex of the first lens and an apex of the second lens and a vector that connects the apex of the first lens and an apex of the third lens is a value different to 0.

In this case, it is possible to suppress diffraction caused by regularity in the lens shape in the cell. Accordingly, it is possible to realize a microlens with a high utilization efficiency of light.

APPLICATION EXAMPLE 3

According to this application example, there is provided a microlens array including P lenses (where P is an integer of 4 or more) arranged in a cell, in which apexes of the P lenses are arranged such that symmetry is at least partially broken, when viewed in plan view.

In this case, it is possible to suppress diffraction caused by regularity in the lens shape in the cell. Accordingly, it is possible to realize a microlens with a high utilization efficiency of light.

APPLICATION EXAMPLE 4

In the microlens array according to Application Example 3, it is preferable that apexes of the P lenses be disorderly arranged in the cell, when viewed in plan view.

In this case, it is possible to more strongly suppress diffraction caused by regularity in the lens shape in the cell. Accordingly, it is possible to realize a microlens with a high utilization efficiency of light.

APPLICATION EXAMPLE 5

According to this application example, there is provided a method for manufacturing a microlens array including: forming a first translucent material on a substrate; forming a mask layer having a first opening portion, a second opening portion, and a third opening portion on the first translucent material; forming a concavity in the first translucent material by subjecting the first translucent material to isotropic etching via the mask layer; and embedding the concavity in a second translucent material with a refractive index different to the refractive index of the first translucent material, in which the first opening portion and the second opening portion are arranged neighboring in a first direction, the first opening portion and the third opening portion are arranged neighboring in a second direction substantially orthogonal to the first direction, and a gap between a center position of the first opening portion and a center position of the second opening portion is different to the gap between the center portion of the first opening portion and a center position of the third opening portion.

In this case, it is possible to suppress diffraction caused by regularity in the lens shape in the cell. Accordingly, it is possible to realize a microlens with a high utilization efficiency of light.

APPLICATION EXAMPLE 6

According to this application example, there is provided a method for manufacturing a microlens array including: forming a first translucent material on a substrate; forming a mask layer having a first opening portion, a second opening portion, and a third opening portion on the first translucent material; forming a concavity in the first translucent material by subjecting the first translucent material to isotropic etching via the mask layer; and embedding the concavity in a second translucent material with a refractive index different to the refractive index of the first translucent material, in which the first opening portion and the second opening portion are arranged neighboring in a first direction, the first opening portion and the third opening portion are arranged neighboring in a second direction substantially orthogonal to the first direction, and an inner product of a vector connecting a center position of the first opening portion and a center position of the second opening portion and a vector connecting the center portion of the first opening portion and a center position of the third opening portion is a value different to 0.

In this case, it is possible to suppress diffraction caused by regularity in the lens shape in the cell. Accordingly, it is possible to realize a microlens with a high utilization efficiency of light.

APPLICATION EXAMPLE 7

According to this application example, there is provided a method for manufacturing a microlens array including: forming a first translucent material on a substrate; forming a mask layer having P opening portions (P is an integer of 4 or more) in a unit area on the first translucent material; forming a concavity in the first translucent material by subjecting the first translucent material to isotropic etching via the mask layer; and embedding the concavity in a second translucent material with a refractive index different to the refractive index of the first translucent material, in which the P opening portions are arranged such that symmetry is at least partially broken, when viewed in plan view.

In this case, it is possible to suppress diffraction caused by regularity in the lens shape in the cell. Accordingly, it is possible to realize a microlens with a high utilization efficiency of light.

APPLICATION EXAMPLE 8

In the method for manufacturing microlens array according to Application Example 7, it is preferable that apexes of the P lenses be disorderly arranged in a unit area, when viewed in plan view.

In this case, it is possible to more strongly suppress diffraction caused by regularity in the lens shape in the cell. Accordingly, it is possible to realize a microlens with a high utilization efficiency of light.

APPLICATION EXAMPLE 9

According to this application example, there is provided an electro-optical device, including the microlens array according to any one of Application Examples 1 to 4.

In this case, it is possible to realize an electro-optical device with a high utilization efficiency of light and capable of bright display.

Application Example 10

According to this application example, there is provided an electro-optical device including a microlens array manufactured by the method of manufacturing a microlens array according to any one of Application Examples 5 to 8.

In this case, it is possible to realize an electro-optical device with a high utilization efficiency of light and capable of bright display.

Application Example 11

According to this application example, there is provided an electronic apparatus including the electro-optical device according to Application Example 9 or 10.

In this case, it is possible to realize an electronic apparatus including an electro-optical device with a high utilization efficiency of light and capable of bright display.

BRIEF DESCRIPTION OF THE DRAWINGS

The invention will be described with reference to the accompanying drawings, wherein like numbers reference like elements.

FIGS. 7A and 7B are schematic cross-sectional views showing a manufacturing method of a microlens array according to Embodiment 1.

DESCRIPTION OF EXEMPLARY EMBODIMENTS

Figure 1:
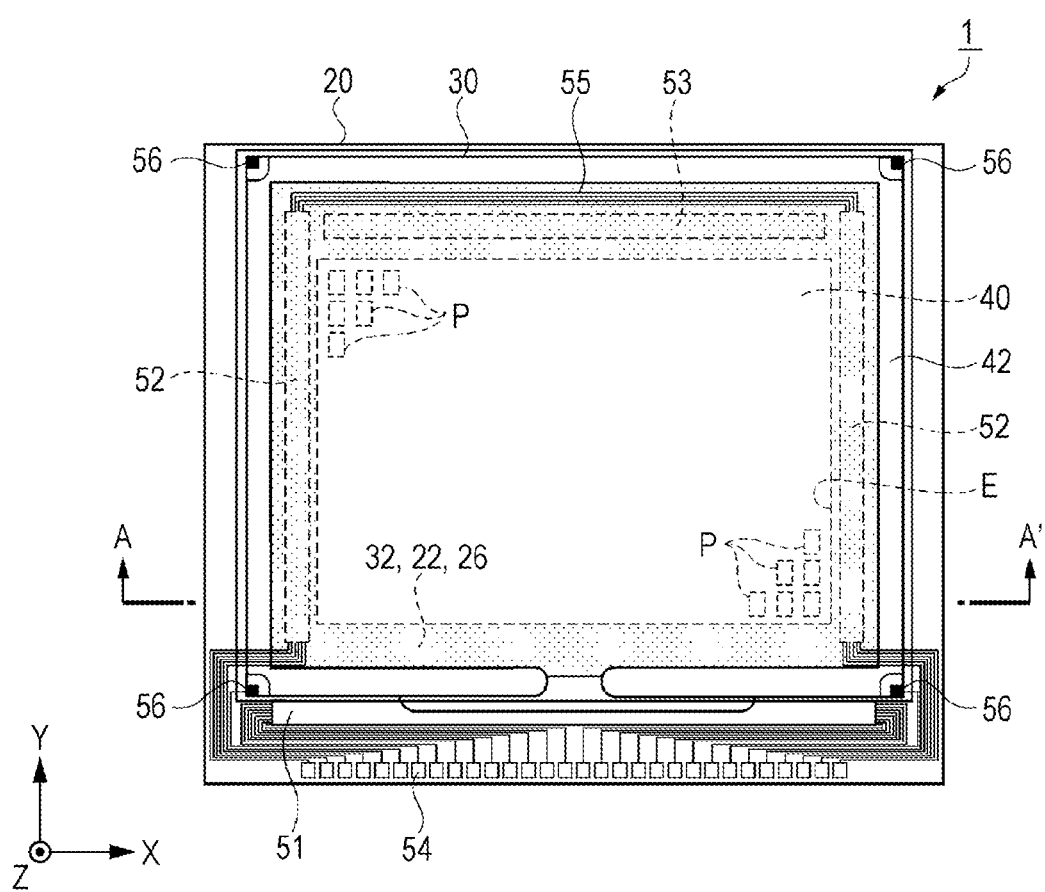
FIG. 1 is a schematic plan view showing a configuration of a liquid crystal device according to Embodiment 1.

Hereinafter, specific embodiments of the invention will be described with reference to the drawings. The drawings to be used are depicted enlarged, reduced or exaggerated as appropriate in order that the parts to be described are recognizable.

There are cases in which elements other than the constituent elements necessary to the description are not shown in the drawings.

In the following forms, for example, a case where "on a substrate" is disclosed indicates a case where arrangement is performed so as to contact the top of the substrate, a case where arrangement is performed via another constituent component on top of the substrate, and a case where a part is arranged so as to contact the top of the substrate, and a part is arranged via another constituent component.

Embodiment 1

Electro-Optical Device

An active matrix-type liquid crystal device including a thin film transistor (TFT) as a pixel switching element will be described as an example of the electro-optical device. The liquid crystal device is able to be suitably used as a light modulating element (liquid crystal light valve) of a projection-type display device (projector) described later.

Figure 2:
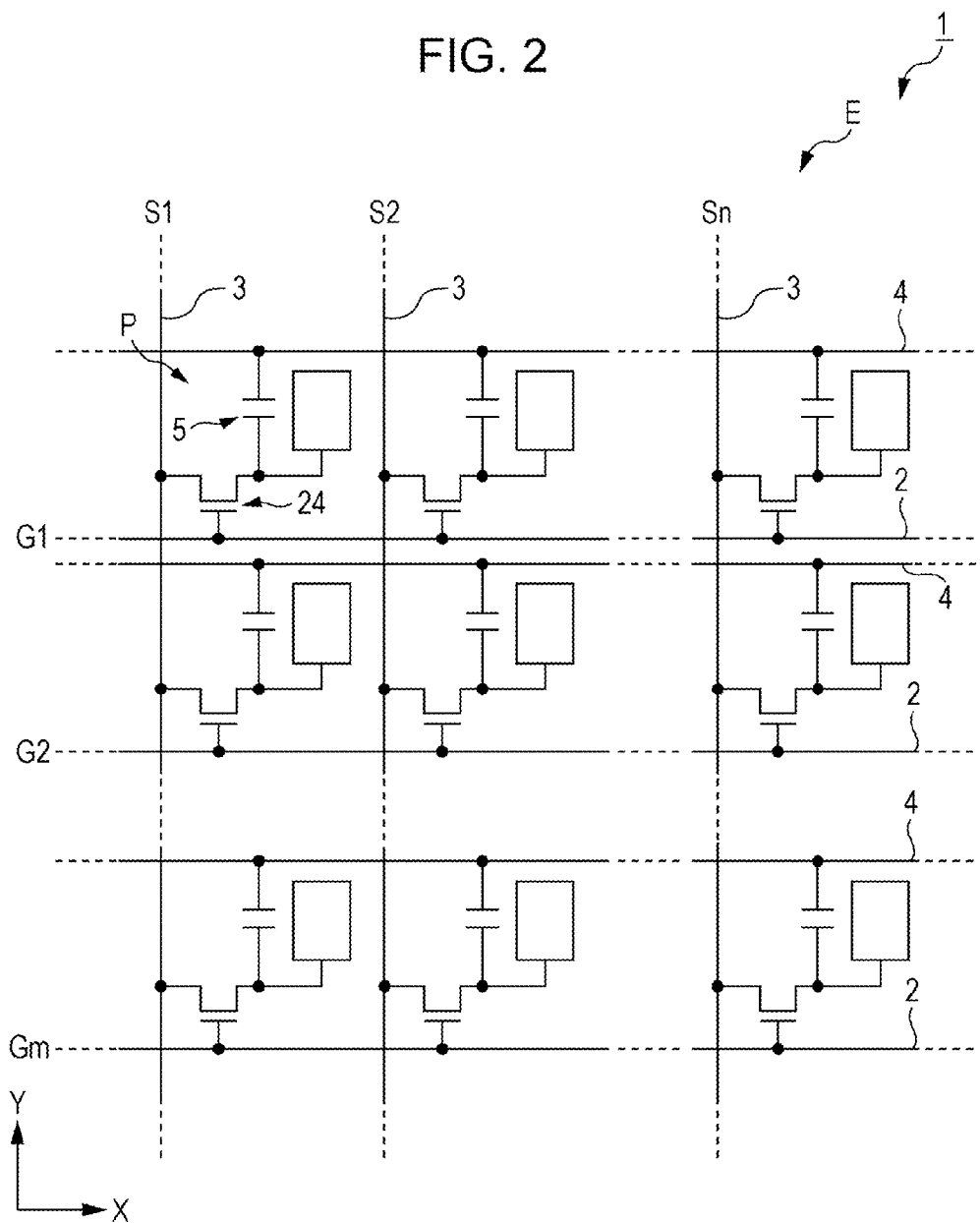
FIG. 2 is an equivalent circuit diagram showing an electrical configuration of the liquid crystal device according to Embodiment 1.
Figure 3:
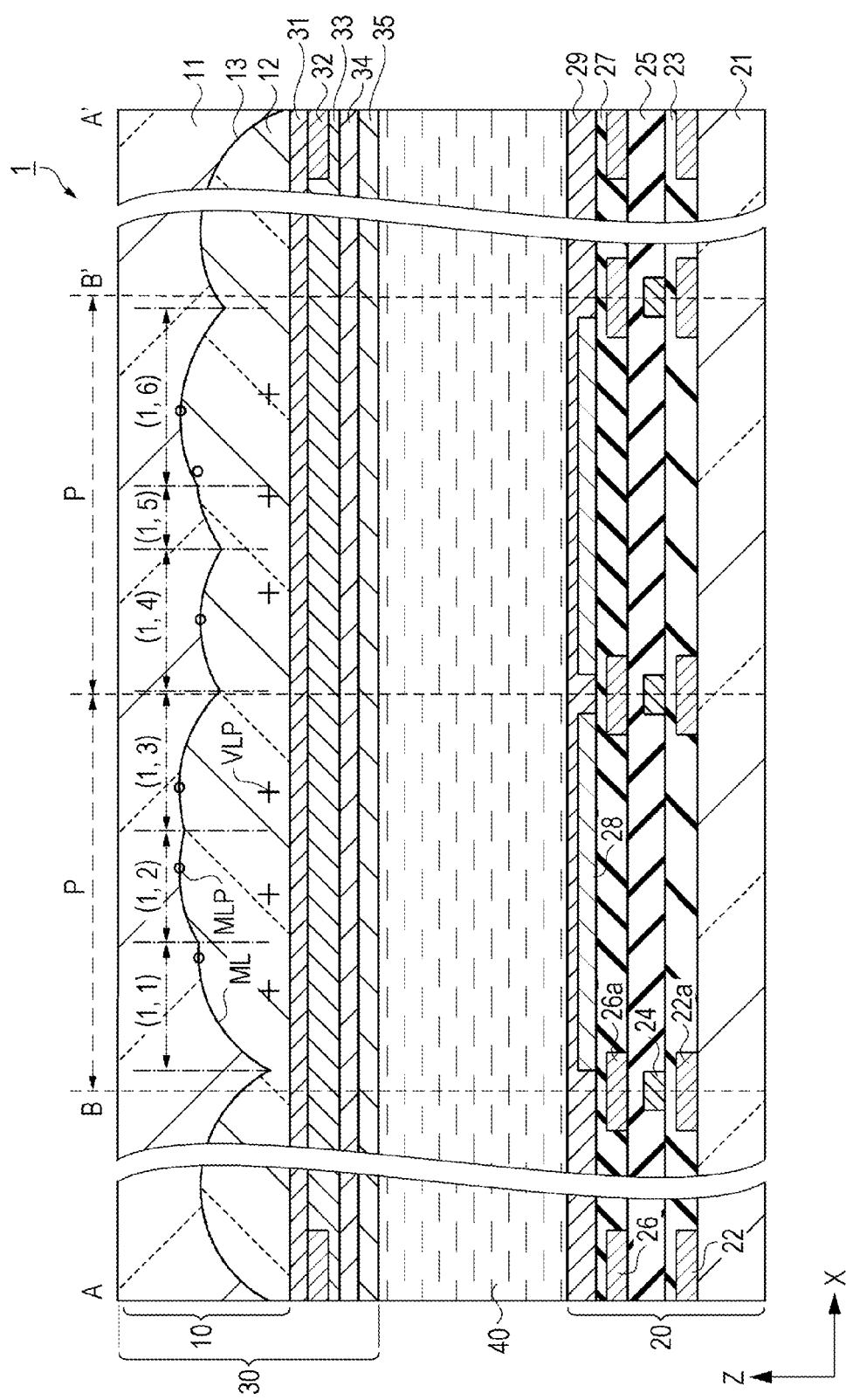
FIG. 3 is a cross-sectional view showing a configuration of a liquid crystal device according to Embodiment 1.

FIG. 1 is a schematic plan view showing a configuration of a liquid crystal device according to Embodiment 1. FIG. 2 is an equivalent circuit diagram showing an electrical configuration of the liquid crystal device according to Embodiment 1. FIG. 3 is a schematic cross-sectional view showing the configuration of the liquid crystal device according to Embodiment 1, and more specifically a partial schematic cross-sectional view taken along line A-A' in FIG. 1 and along line B-B' in FIG. 4. Firstly, a liquid crystal device 1 according to Embodiment 1 will be described with reference to FIGS. 1, 2, and 3.

As shown in FIGS. 1 and 3, the liquid crystal device 1 according to Embodiment 1 includes an element substrate 20 as a first substrate, a counter substrate 30, as a second substrate, arranged facing the element substrate 20, a seal material 42, and a liquid crystal 40 as an electro-optical material. The element substrate 20 and the counter substrate 30 are arranged facing one another. As shown in FIG. 1, the element substrate 20 is larger than the counter substrate 30, and both substrates are bonded via a seal material 42 arranged in a frame shape along the peripheral edge of the counter substrate 30.

As shown in FIG. 1, the liquid crystal 40 is pinched in the space surrounded by the element substrate 20, the counter substrate 30, and the seal material 42, and has positive or negative dielectric anisotropy. The seal material 42 is formed from, for example, an adhesive such as a thermosetting or ultraviolet curable epoxy resin. A spacer (not shown) for holding the gap between the element substrate 20 and the counter substrate 30 constant is mixed into the seal material 42.

A light blocking layer 32 (22, 26) as a light blocking portion having a frame-shaped peripheral edge portion is provided at the inner side of the seal material 42 arranged in a frame shape. The light blocking layer 32 (22, 26) is formed from, for example, a metal or metal oxide with light blocking properties. The inner side of the light blocking layer 32 (22, 26) forms a display region E in which a plurality of pixels P is arranged. The pixels P, for example, have a substantially rectangular shape and are arranged in a matrix pattern.

The display region E is a region substantially contributing to display in a liquid crystal device 1. As shown in FIG. 3, the light blocking layer 22a and 26b are provided in a lattice pattern at the boundary portion of each pixel P so as to planarly partition the pixels P in the display region E. The liquid crystal device 1 includes a dummy region that does not substantially contribute to display, and provided so as to surround the periphery of the display region E.

A data line driving circuit 51 and a plurality of external connection terminals 54 are provided along a first side on the opposite side of the display region E of the seal material 42 formed along the first side of the element substrate 20. A test circuit 53 is provided on the display region E side of the seal material 42 along another second side facing the first side. A scanning line driving circuit 52 is provided on the inner side of the seal material 42 along another two opposing side portions orthogonal to the two side portions.

A plurality of wirings 55 joining two scanning line driving circuits 52 is provided on the display region E side of the seal material 42 on the second side on which the test circuit 53 is provided. The wirings joining the data line driving circuit 51 and the scanning line driving circuit 52 are connected to a plurality of external connection terminals 54. A vertical conduction portion 56 for obtaining electrical conduction between the element substrate 20 and the counter substrate 30 is provided in the corner portion of the counter substrate 30. The arrangement of the test circuit 53 is not limited to the configuration, and may be provided at a position along the inner side of the seal material 42 between the data line driving circuit 51 and the display region E.

In the description below, a direction along the first side on which the data line driving circuit 51 is provided is made the first direction (X direction), and a direction orthogonal to the first side made the second direction (Y direction). The X direction is the direction parallel to the line A-A' in FIG. 1. A black matrix is provided in a lattice form along the X direction and the Y direction by the light blocking layers 22a and 26a on the element substrate 20. Accordingly, the pixels P are partitioned in a lattice form by the black matrix formed from the light blocking layers 22a and 26a, and regions in which the light blocking layers 22a and 26a do not overlap in plan view in the pixels P become the opening regions (light modulating portion) in the pixels P.

The direction facing upwards in FIG. 1 and orthogonal to the X direction and the Y direction is the Z direction. In the specification, the viewing from the normal line direction (Z direction) of the surface of the counter substrate 30 side of the liquid crystal device 1 is referred to as "in plan view".

As shown in FIG. 2, scanning lines 2 and data lines 3 are formed so as to intersect one another, and pixels P are provided corresponding to the intersections of the scanning lines 2 and the data lines 3 in the display region E. A pixel electrode 28 and a TFT 24 that is a switching element is provided for each of the pixels P.

One of the source and drain of the TFT 24 is electrically connected to the data line 3 extending from the data line driving circuit 51. Image signals S1, S2, . . . , Sn are supplied from the data line driving circuit 51 to the data lines 3 (refer to FIG. 1). The gate of the TFT 24 is electrically connected to a portion of the scanning line 2 extending from the scanning line driving circuit 52. Scanning signals G1, G2, . . . , Gm are supplied from the scanning line driving circuit 52 to the scanning lines 2. The other of the source and drain of the TFT 24 is electrically connected to the pixel electrode 28.

The image signals S1, S2, . . . , Sn are written at a predetermined timing to the pixel electrode 28 via the data lines 3 by setting the TFT 24 to the on state for a fixed time only. Because the image signals S1, S2, . . . , Sn supplied to the pixel electrode 28 are maintained in the pixel P, a storage capacitor 5 is formed between the capacitance line 4 formed along the scanning line 2 and the pixel electrode 28. A storage capacitor 5 is arranged in parallel with the liquid crystal capacitor. In this way, when a voltage is applied to the liquid crystal 40 (refer to FIG. 3) of each pixel P according to the image signals S1, S2, . . . , Sn, the alignment state of the liquid crystal 40 is changed due to the applied voltage, and gradation display is possible by modulating the light incident on the liquid crystal 40.

As shown in FIG. 3, the liquid crystal device 1 includes the element substrate 20 and the counter substrate 30, the counter substrate 30 further includes a microlens array 10, optical path length-adjusting layer 31, a light blocking layer 32, a protective layer 33, a common electrode 34, and an alignment film 35. In FIG. 3, in order for the description to be easily understood, a cross-section of two pixels is depicted.

The microlens array 10 includes a first translucent material 11 and a second translucent material 12. The first translucent material 11 is formed from an inorganic material having optical transparency, such as silicon oxide ($SiO_2$). In the embodiment, the first translucent material 11 is a quartz substrate, and is a substrate for the counter substrate 30. A concavity 13 is formed in the first translucent material 11. The translucent material in the present specification is a member through which light passes, and includes a transparent member through which the entire visible region of light passes, a colored member through which a portion of the visible region of light passes, or the like. In the embodiment, although a transparent member, such as silicon oxide or silicon oxynitride (SiON) is used as the translucent material, it is possible to use a material through which a specified wavelength of light passes as the translucent material in a case in which a microlens array 10 is used with respect to the specified wavelength of light.

The second translucent material 12 covers the first translucent material 11 and is formed so as to embed the concavity 13. The second translucent material 12 is formed from a material that has optical transparency, and has a refractive index different to the first translucent material 11. More specifically, the second translucent material 12 is formed from an inorganic material with a higher refractive index than the first translucent material 11. Examples of such an inorganic material, for example, include silicon oxynitride (SiON) and alumina ($Al_2O_3$). The concavity 13 is embedded by the second translucent material 12, and a convex microlens ML is configured. The microlens ML will be described in detail later. A plurality of types of concavity 13 is arranged for each pixel P. Accordingly, a plurality of types of microlens ML is arranged for each pixel P.

The second translucent material 12 is formed thicker than the depth of the concavity 13, and the surface of the second translucent material 12 becomes a substantially flat surface. That is, the second translucent material 12 includes a part that configures the microlens ML by embedding the concavity 13, and a part that serves the role of a planarizing layer that covers the upper surface of first translucent material 11 and the surface of the microlens ML.

The optical path length-adjusting layer 31 is provided so as to cover the microlens array 10. The optical path length-adjusting layer 31 is formed from an inorganic material that has optical transparency, and, for example, has substantially the same refractive index as the first translucent material 11. The optical path length-adjusting layer 31 adjusts the distance from the microlens ML to the light blocking layer 26a, and is set so that light collected by the microlens ML passes through the opening region of the pixel P without being blocked by the light blocking layers 26a and 22a. Accordingly, the thickness of the optical path length-adjusting layer 31 is appropriately set based on the optical conditions, such as the focal distance of the microlens ML according to the wavelength of light.

The light blocking layer 32 is provided on the optical path length-adjusting layer 31 (liquid crystal 40 side). The light blocking layer 32 is formed in a frame shape so as to overlap the light blocking layer 22 and the light blocking layer 26 of the element substrate 20 in plan view. The region (display region E) surrounded by the light blocking layer 32 is a region through which light is able to pass.

The protective layer 33 is provided so as to cover the optical path length-adjusting layer 31 and the light blocking layer 32. The common electrode 34 is provided so as to cover the protective layer 33. The common electrode 34 is formed straddling a plurality of pixels P. The common electrode 34, for example, is formed from a transparent conductive film, such as indium tin oxide (ITO) and indium zinc oxide (IZO). The alignment film 35 is provided so as to cover the common electrode 34.

The protective layer 33 covers the light blocking layer 32, and flattens the surface of the liquid crystal 40 side of the common electrode 34, and is not an essential constituent element. Accordingly, for example, the common electrode 34 may be configured to directly cover the conductive light blocking layer 32.

The element substrate 20 includes a substrate 21, light blocking layers 22 and 22a, an insulating layer 23, a TFT 24, an insulating layer 25, light blocking layers 26 and 26a, an insulating layer 27, a pixel electrode 28, and an alignment film 29. The substrate 21 is formed from a material having optical transparency, such as, for example, glass or quartz.

The light blocking layers 22 and 22a are provided on the substrate 21. The light blocking layer 22 is formed in a frame shape so as to overlap the upper layer of the light blocking layer 26 in plan view. The light blocking layers 22a and 26a are arranged so as to interpose the TFT 24 therebetween in the thickness direction (Z direction) of the element substrate 20. The light blocking layers 22a and 26a overlap at least the channel forming region of the TFT 24 in plan view. The incidence of light on the TFT 24 is suppressed by the light blocking layers 22a and 26a being provided. In plan view, the region surrounded by the light blocking layers 22a and 26a is a region through which light passes in the pixel P.

The insulating layer 23 is provided so as to cover the substrate 21 and the light blocking layers 22 and 22a. The insulating layer 23, for example, is formed from an inorganic material such as $SiO_2$.

The TFT 24 is provided on the insulating layer 23. The TFT 24 is a switching element that drives the pixel electrode 28. The TFT 24 includes a semiconductor layer, a gate electrode, a source electrode, and a drain electrode, not shown. A source, a channel forming region and a drain are formed in the semiconductor layer. A lightly doped drain (LDD) region may be formed in the interface of the channel forming region and the source, or the channel forming region and the drain.

The gate electrode is formed via a portion (gate insulating film) of the insulating layer 25 in the region overlapping the channel forming region of the semiconductor layer on the element substrate 20 in plan view. Although not shown in the drawings, the gate electrode is electrically connected to the scanning line arranged on the lower layer side via a contact hole, and the TFT 24 is controlled to be on or off by a scanning signal being applied.

The insulating layer 25 is provided so as to cover the insulating layer 23 and the TFT 24. The insulating layer 25, for example, is formed from an inorganic material such as $SiO_2$. The insulating layer 25 includes a gate insulating film insulating between the semiconductor layer of the TFT 24 and the gate electrode. The unevenness of the surface formed due to the TFT 24 is moderated by the insulating layer 25. The light blocking layers 26 and 26*a* are provided on the insulating layer 25. The insulating layer 27 formed from an inorganic material is provided so as to cover the insulating layer 25, and the light blocking layers 26 and 26*a*.

A pixel electrode 28 is provided for each pixel P on the insulating layer 27. The pixel electrode 28 is arranged so as to overlap the opening region of the pixel P in plan view, and the edge portion of the pixel electrode 28 overlaps the light blocking layer 22*a* or the light blocking layer 26*a*. The pixel electrode 28, for example, is formed from a transparent conductive film, such as ITO or IZO. The alignment film 29 is provided so as to cover the pixel electrode 28. The liquid crystal 40 is pinched between the alignment film 29 of the element substrate 20 and the alignment film 35 of the counter substrate 30.

Moreover, the TFT 24, the electrodes supplying electrical signals to the TFT 24, or the wirings (not shown) are provided in the region that overlaps the light blocking layers 22 and 22*a* and the light blocking layers 26 and 26*a* in plan view. Moreover, these electrodes, wirings and the like may have a configuration doubling as the light blocking layers 22 and 22*a* and the light blocking layers 26 and 26*a*.

In the liquid crystal device 1 according to Embodiment 1, for example, light emitted from the light source or the like is incident from the side of the counter substrate 30 including the microlens ML, and is collected by the microlens ML. For example, even light incident on the region overlapping, in plan view, the light blocking layers 22*a* and 26*a* is collected to the flat center side of the pixel P by the microlens ML (refraction by the refractive index difference between the first translucent material 11 and the second translucent material 12). In the liquid crystal device 1, incident light that is blocked by the light blocking layers 22*a* and 26*a* in a case of directly progressing in this way is made incident in the opening region of the pixel P by the collection action of the microlens ML, and is able to pass through the liquid crystal 40. As a result, the amount of light emitted from the element substrate 20 side increases, the utilization efficiency of light is increased.

Microlens Array

Figure 4:
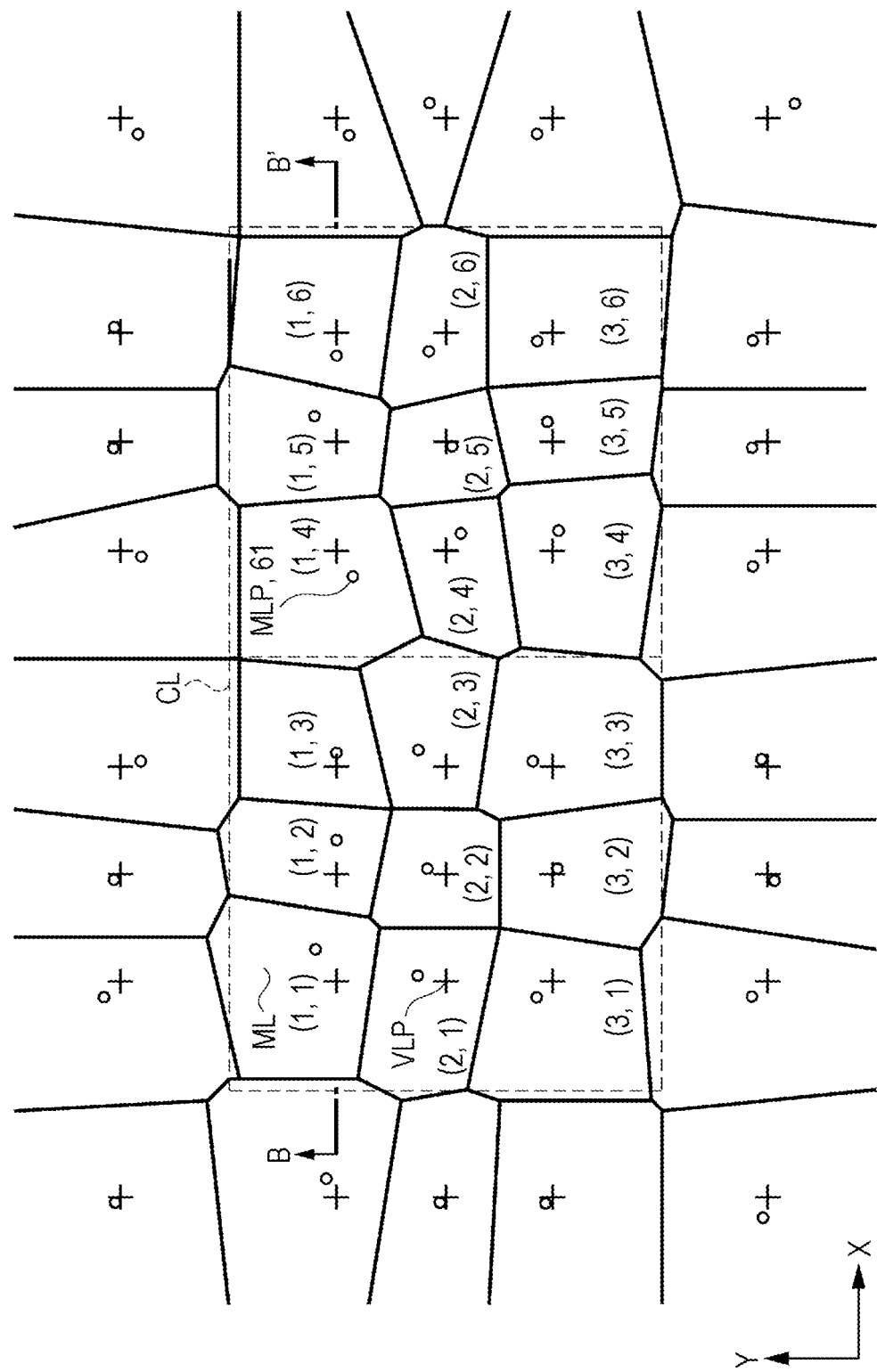
FIG. 4 is a diagram describing a planar configuration of the microlens array according to Embodiment 1.
Figure 5A:
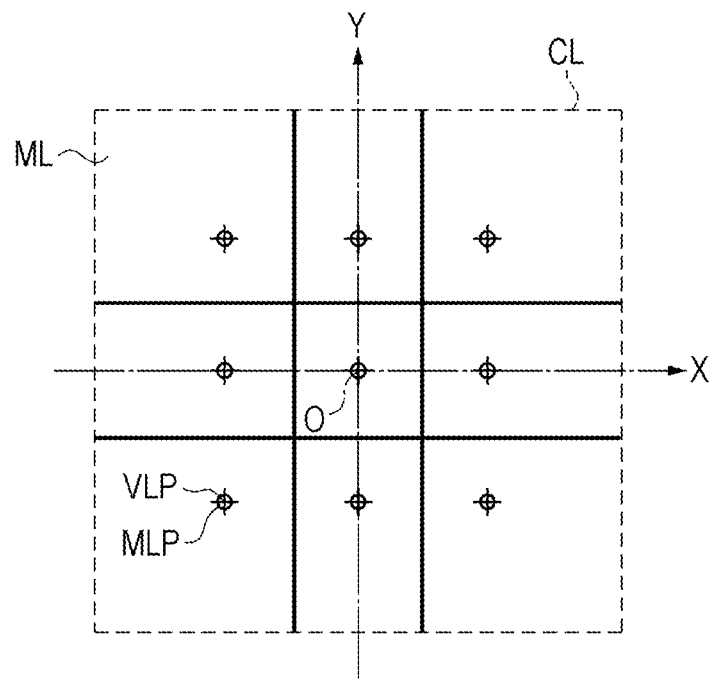
FIGS. 5A and 5B are plan views describing the principles of a microlens array.
Figure 5B:
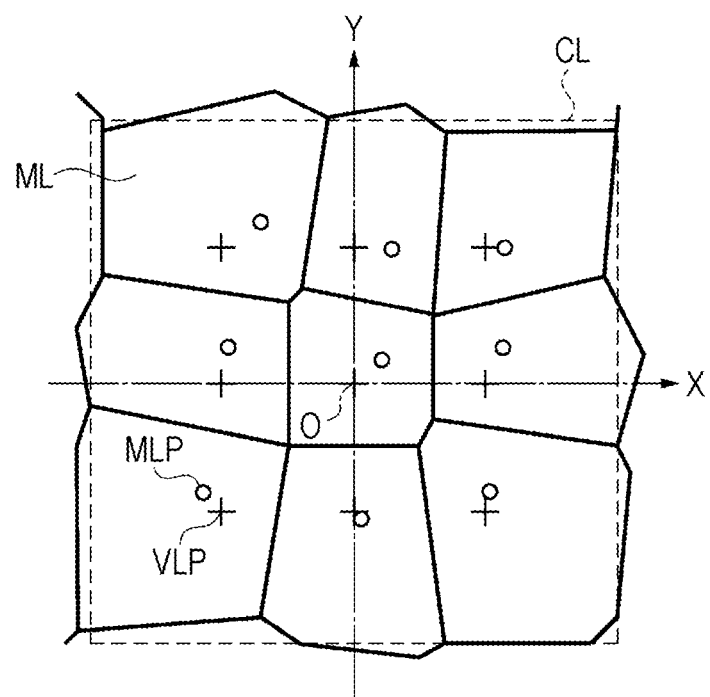

FIG. 4 is a diagram describing a planar configuration of the microlens array according to Embodiment 1. FIGS. 5A and 5B are plan views describing the principles of a microlens array. FIG. 5A shows the planar configuration of one cell according to a comparative example and FIG. 5B shows an example of the planar configuration of one cell of the microlens array according to Embodiment 1. Next, the configuration of the microlens array 10 according to Embodiment 1 will be described with reference to FIGS. 4 to 5B. Although FIG. 5A describes a comparative example corresponding to the related art, in order for the description to be easily understood, the element and names in common with the microlens array 10 of the embodiment use the same reference numerals.

As shown in FIG. 4, the microlens array 10 includes a plurality of cells CL, and the cells CL are arranged in a matrix in the X direction and the Y direction. When the microlens array 10 is applied to an electro-optical device, one cell CL of the microlens array 10 and one pixel P of the electro-optical device are aligned in plan view. In short, the size of one cell CL that configures the microlens array 10 and the position in plan view thereof and the size of one pixel P of the electro-optical device and the position in plan view thereof match in design concept. That is, except for manufacturing errors, the size of the cells CL and the position thereof in plan view and the size of the pixel P and the position thereof in plan view match. In FIG. 4, a plan view of two cells CL is depicted mainly as an example, and when the microlens array 10 is applied to the liquid crystal device 1, the cross-sectional view taken along line B-B' in FIG. 4 is depicted as line B-B' in FIG. 3.

P (P is an integer of 4 or more) microlenses ML are arranged in each cell CL. In the embodiment, P=9, and nine microlenses ML are arranged in three rows by three columns in the cell CL. As an example, nine microlenses ML, (1,1), (1,2), (1,3), (2,1), (2,2), (2,3), (3,1), (3,2), (3,3) are arranged in the left side cell CL in FIG. 4, and nine microlenses ML, (1,4), (1,5), (1,6), (2,4), (2,5), (2,6), (3,4), (3,5), (3,6) are arranged in the right side cell CL in FIG. 4.

In each cell CL, the apexes of the P microlenses ML (microlens peak MLP) are arranged such that symmetry is at least partially broken in plan view. Next, breaking the symmetry of the microlens peaks MLP will be described. First, it is assumed that the P grid points corresponding to the P microlenses ML are in one cell CL (virtual lattice point VLP). In the drawings, such as FIG. 4, the positions of the microlens peaks MLP are indicated by the circle mark, and the positions of the virtual lattice points VLP are indicated by the cross marks. The apexes of the microlenses ML (microlens peak MLP) are the positions where the lens thickness in the convex lenses is the thickest, and the positions where the lens thickness in the concave lens is the thinnest. In cases where the regions where the lens thickness in the convex lens is the thickest have a flat bottomed shape in which the surface shape widens in plan view, the center of gravity in plan view of the flat bottomed region (center of the flat bottomed region in plan view) is the apex of the microlens ML (microlens peak MLP). Similarly, in cases in which the regions with the thinnest lens thickness in the concave lens have a flat bottomed shape in which the surface shape widens in plan view, the center of gravity in plan view of the flat bottomed region (center of the flat bottomed region in plan view) is the apex of the microlens ML (microlens peak MLP).

The virtual lattice point VLP is a point at which any of the shapes in the cell CL retain symmetry. For example, as shown in FIGS. 5A and 5B, a Cartesian coordinate system is considered with the center of the cell CL as the origin point. In FIGS. 5A and 5B, the virtual lattice point VLP is provided at the intersection point at which the cells CL are evenly divided. For example, in the cell CL of the microlens array 10 of the embodiment shown in FIG. 5B, (Px-1)×(Py-1) virtual lattice points VLP are arranged at the intersection of Px-1 segments by which the cell CL is equally divided in Px parts in the X direction and Py-1 segments by which the cell CL is equally divided in Py parts in the Y direction. In the embodiment, Px=Py=4. As a result, the (Px-1)×(Py-1) virtual lattice points VLP retain symmetry such as translational symmetry relating to the X direction and Y direction, rotational symmetry around the origin point O, and mirror inversion symmetry relating to the X axis or the Y axis.

In the comparative example shown in FIG. 5A, because the microlens peak MLP and the virtual lattice point VLP match, the (Px-1)×(Py-1) microlens peaks MLP also retain symmetry, such as translational symmetry relating to the X direction and the Y direction, rotational symmetry around the origin point O, and mirror inversion symmetry relating to the X axis or the Y axis. According to thorough research by the present inventors, the reason why the utilization efficiency of light in the electro-optical device using the microlens ML of the related art is low is described as below. That is, in the electro-optical device using the microlens array 10 as disclosed in JPA-2011-158755, since the lens arrangement in the pixel has symmetry (regularity), diffraction caused by the regularity of the lenses in the pixel occurs in addition to the diffraction caused by the regularity of the pixels. Because spreading of the luminous flux due to diffraction increases in inverse relation to the lattice constant (pixel size and inter-lens distance), more intense diffraction occurs in an electro-optical device in which a plurality of lenses is regularly arranged in one pixel than in an electro-optical device in which one lens is arranged in one pixel. As a result, the spread angle of light due to interference of the diffracted light further increases. As a result, it is thought that the solid angle of the emission light from the electro-optical device of the related art increases and the proportion incident on the projection lens is reduced, and the brightness in the electro-optical device of the related art is lowered.

Thus, in the microlens array 10 of the embodiment, in each cell CL, at least one of the P (in the embodiment, P=(Px-1)×(Py-1)) microlens peaks MLP is arranged at a position shifted from the virtual lattice point VLP in plan view as shown in FIGS. 4 and 5B. As a result, the symmetry of the P microlens peaks MLP is at least partially broken in plan view. In practice, in the cell CL shown in FIG. 5B, the P microlens peaks MLP do not match the virtual lattice points VLP, and, as a result, the P microlens peaks MLP do not have translational symmetry, rotational symmetry, or mirror inversion symmetry. In short, the translational symmetry, rotational symmetry, and mirror inversion symmetry of the P microlens peaks MLP are broken in plan view, and the microlens peaks MLP are disorderly arranged in the cell CL. When the symmetry of the P microlens peaks MLP is at least partially broken in plan view, since diffraction caused by the regularity of the lens shape in the pixel is suppressed, a microlens ML with a high utilization efficiency of light is realized. When the P microlens peaks MLP are disorderly arranged in the cell CL, diffraction caused by the regularity of the lens shape in the cell CL is more strongly suppressed, and a microlens ML with an even higher utilization efficiency of light is realized.

Here, the three microlenses ML arranged in the cell CL are a first lens, a second lens and a third lens. The first and second lenses are two microlenses ML arranged neighboring in the first direction (X axis direction), and the third lens is a microlens ML arranged neighboring the first lens in the second direction (Y axis direction) orthogonal to the first direction. In the microlens array 10 of the embodiment, because the symmetry of the P microlens peaks MLP in one cell CL is at least partially broken in plan view, three microlenses ML are present in the cell CL such that the distance between the apex of the first lens and the apex of the second lens is different to the distance between the apex of the first lens and the apex of the third lens. Three microlenses ML are present in the cell CL such that the inner product of a vector that connects the apex of the first lens and the apex of the second lens and a vector that connects the apex of the first lens and the apex of the third lens is a value different to 0. In practice, as shown in FIG. 4, for example, if the (2,2) microlens ML is the first lens, the (2,3) microlens ML is the second lens, and the (1,2) microlens ML is the third lens, the distance between the apex of the first lens and the apex of the second lens is different to the distance between the apex of the first lens and the apex of the third lens. Since the angle of the vector that connects the apex of the first lens and the apex of the second lens and the vector that connects the apex of the first lens and the apex of the third lens is a value different to 90°, the inner product of the vector that connects the apex of the first lens and the apex of the second lens and the vector that connects the apex of the first lens and the apex of the third lens is a value different to 0.

Cell Arrangement in Display Region

Figure 6:
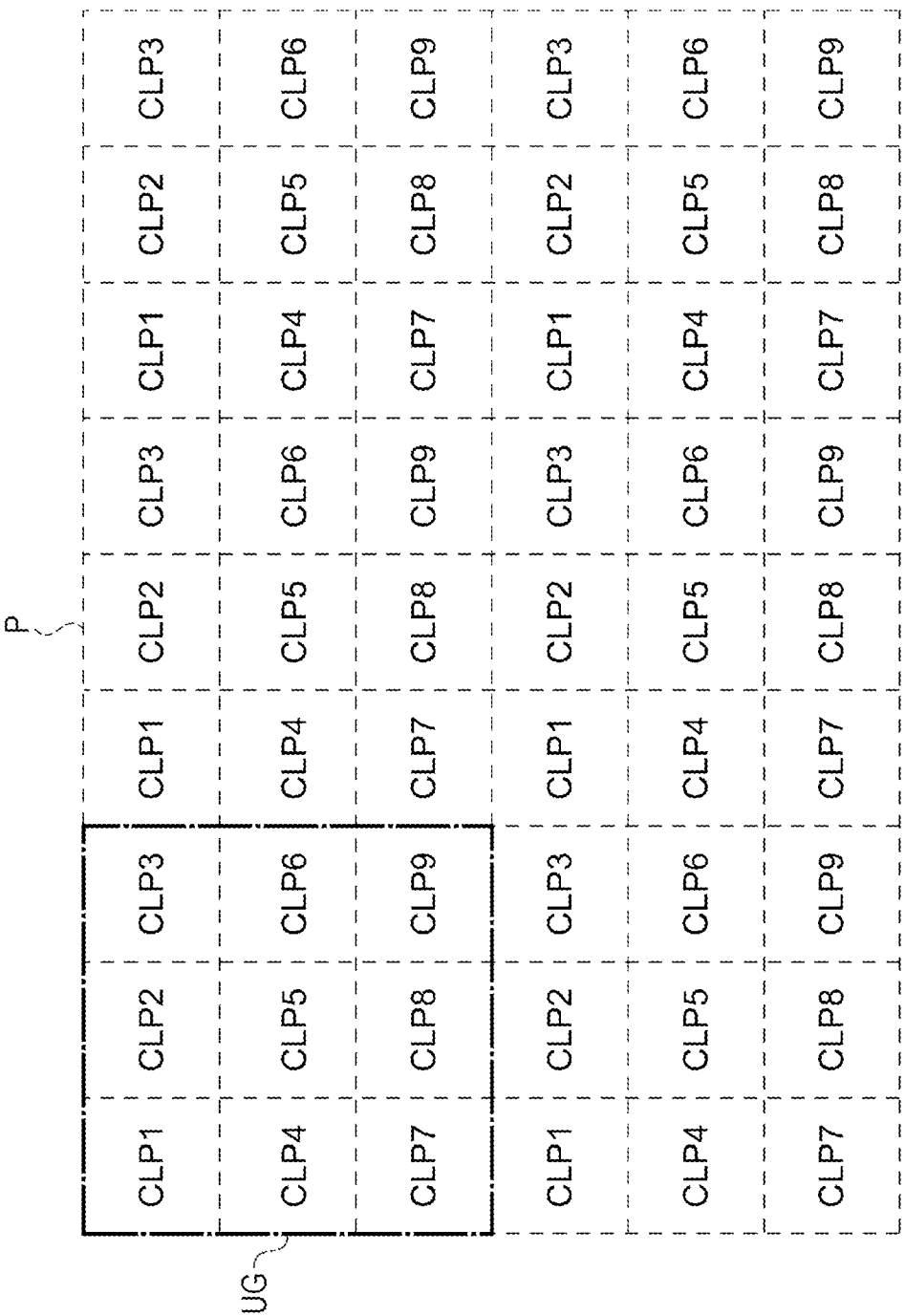
FIG. 6 is a diagram describing a planar cell arrangement of the microlens array according to Embodiment 1.

FIG. 6 is a diagram describing a planar cell arrangement of the microlens array according to Embodiment 1. Next, the configuration relating to the cell CL arrangement of the microlens array 10 according to Embodiment 1 will be described with reference to FIG. 6.

It is preferable that the period of the regularity caused by the cell CL be sufficiently greater than the wavelength in order to suppress the diffraction caused by the regularity of the cell CL. Ideally, the period of the regularity caused by the cell CL be approximately 100 times or more the wavelength of light. In so doing, diffraction caused by the regularity of the cell CL is remarkably suppressed. In other words, in a range within approximately 100 times the wavelength, the cells CL that configure the microlens array 10 being different to one another is ideal. The phrasing "the cells CL are different" indicates that the lens shapes that configure the cells CL (arrangement shape of the microlens peaks MLP) are each unique. In the embodiment, since it is assumed that the light is mainly visible light, a cell CL not having regularity within a range of approximately 70 microns (μm) to suppress the interference of visible light is ideal. Meanwhile, in the electro-optical device, since small pixel (cell CL) size of approximately 7 microns (μm) may be obtained, it can be said that in such a case, all of the cells CL in a unit of 10 cells CL×10 cells CL being different is ideal. Specifically, with n-squared ($n^2$) cells CL as a unit cell group UG, the n-squared ($n^2$) cells CL in the unit cell group UG are different to one another (the lens shapes in the n-squared ($n_2$) cells CL are different to one another). The microlens array 10 is configured by repeating the unit cell groups UG. In this case, n is in a range of 2 or more and 20 or less, and n being approximately 10 is ideal.

If n is 10, although 100 types of different cells CL may be formed, this is not easy. In the embodiment, as shown in FIG. 6, cell lens pattern CLP1 to cell lens pattern CLP9 form nine different types of cell CL, the nine types of cell CL as a unit cell group UG are repeated in the X direction and the Y direction, thereby forming the microlens array 10. The examples of the cell lens patterns CLP1 and CLP2 are two cells CL depicted in the center of FIG. 4. In FIG. 6, 54 cells CL in 6 rows by 9 columns are depicted as an example, and are considered as 6 unit cell groups UG. By doing so, diffraction caused by regularity of the cells CL is suppressed, and the utilization efficiency of light is further improved.

Method for Manufacturing Electro-Optical Device

FIGS. 7A and 7B are schematic cross-sectional views showing a manufacturing method of a microlens array according to Embodiment 1. Next, the method for manufacturing the liquid crystal device 1 including the microlens array 10 according to Embodiment 1 will be described with reference to FIGS. 7A and 7B. FIGS. 7A and 7B correspond to a cross-sectional view taken along line B-B' in FIG. 4 when the microlens array 10 is completed. Although not shown, in the manufacturing steps of the microlens array 10, a large-sized substrate (mother substrate) from which a plurality of microlens arrays 10 may be taken is worked, and, by separating the mother substrate into individual pieces, a plurality of microlens arrays 10 is finally obtained. Accordingly, although work is performed in each step described below in a state before the mother substrate is divided into individual pieces, here, work with respect to individual microlens arrays 10 in the mother substrate will be described.

First, a step for forming the first translucent material 11 on a substrate is performed. In the embodiment, since a quartz substrate doubles as the first translucent material 11, the step is a step for preparing a quartz substrate.

Next, a step for forming a mask layer 60 on the first translucent material 11 follows. The mask layer 60, as shown in FIG. 7A, has P opening portions 61 (P is an integer of 4 or more) in a unit area UA on the first translucent material 11, and the P opening portions 61 are arranged such that symmetry is at least partially broken in plan view. The unit area UA is a region that becomes the cell CL when the microlens array 10 is completed. The opening portions 61 are locations that match the microlens peaks MLP in plan view when the microlens array 10 is completed. That is, the (X,Y) coordinates of the opening portions 61 approximately match the (X,Y) coordinates of the microlens peaks MLP. Although FIG. 7A shows a partial cross-sectional view taken along line B-B' in FIG. 4 as an example, in order for the description to be easily understood, the opening portions 61b not appearing on the line B-B' (for example, the opening portions 61b for manufacturing the (1,1) microlens ML, the (1,4) microlens ML and the (1,5) microlens ML in FIG. 4) are also shown. The opening portion 61a (for example, the opening portion 61a for manufacturing the (1,2) microlens ML, the (1,3) microlens ML, and the (1,6) microlens ML in FIG. 4) appearing on the line B-B' is depicted outlined. The virtual lattice points VLP in FIGS. 7A and 7B are indicated by cross marks.

The P opening portions 61 are arranged such that symmetry is at least partially broken in plan view. That is, at least 1 of the P opening portions 61 is arranged at a position shifted from the virtual lattice point VLP in plan view. As shown in the embodiment, it is preferable that the P opening portions 61 be disorderly arranged in the unit area UA. The three appropriate opening portions 61 formed in the unit area UA are the first opening portion, the second opening portion, and the third opening portion. The first and second opening portions are two opening portions 61 arranged neighboring substantially along the first direction (X axis direction), and the third opening portion is an opening portion 61 arranged neighboring the first opening portion substantially along the second direction (Y axis direction) orthogonal to the first direction. In the embodiment, in order for the symmetry of the P opening portions 61 in one unit area UA to be at least partially broken in plan view, three opening portions 61 are present in the unit area UA such that the gap between the center position of the first opening portion in plan view and the center position of the second opening portion in plan view and the gap between the center position of the first opening portion in plan view and the center position of the third opening portion in plan view are different. The three opening portions 61 are present in the unit area UA such that the inner product of a vector that connects the center position of the first opening portion in plan view and the center position of the second opening portion in plan view and a vector that connects the center position of the first opening portion in plan view and the center position of the third opening portion in plan view is a value different to 0. For example, if the opening portion 61 for manufacturing the (2,2) microlens ML in FIG. 4 is the first opening portion, the opening portion 61 for manufacturing the (2,3) microlens ML is the second opening portion, and the opening portion 61 for manufacturing the (1,2) microlens ML is the third opening portion, the gap between the center position of the first opening portion and the center position of the second opening portion and the gap between the center position of the first opening portion and center position of the third opening portion are different. Since the angle of the vector that connects the center position of the first opening portion and the center position of the second opening portion and the vector that connects the center position of the first opening portion and the center position of the third opening portion is a value different to 90°, the inner product of the vector that connects the center position of the first opening portion and the center position of the second opening portion and the vector that connects the center position of the first opening portion and the center position of the third opening portion is a value different to 0.

Such a mask layer 60 is formed from a polycrystalline silicon, for example, on the first translucent material 11. The polycrystalline silicon that is the mask layer 60 is deposited, for example, by a chemical vapor deposition (CVD) method, or a physical vapor deposition method (for example, a sputtering method or the like) or the like. The deposited thin film is subjected to a photolithography method and dry etching process, and the mask layer 60 having opening portions 61 is formed.

Next, by subjecting the first translucent material 11 to isotropic etching via the mask layer 60, a step for forming a concavity in the first translucent material 11 is performed. That is, the first translucent material 11 is subjected to an isotropic etching, such as wet etching, using an etching solution, such as an aqueous hydrofluoric acid solution, via the mask layer 60. Through the etching process, the first translucent material 11 is isotropically etched from the upper surface side with the opening portion 61 as a center. As a result, as shown in FIG. 7A, concavities 13 corresponding to the opening portions 61 are formed in the first translucent material 11. Through the etching process, the concavities 13 are formed in a semi-spherical shape, and have a concentric circular shape with the opening portions 61 as a center in plan view. The etching amount in the planar direction (X direction and Y direction) from the opening portion 61 and the etching amount in the depth direction (Z direction) are approximately the same. Although the etching amounts in the thickness direction (Z direction) from each opening portion 61 are all approximately identical, since the cross-sectional shape on the line B-B' is depicted in FIGS. 7A and 7B, the etching depth from the opening portions 61b not on the line B-B' is depicted as shallower than the etching depth form the opening portions 61a on the line B-B'.

After the etching process is finished, the mask layer 60 is removed from the first translucent material 11, and a step for embedding the concavities in a second translucent material 12 having a refractive index different to the refractive index of the first translucent material 11 is performed. The second translucent material 12 formed from an inorganic material with optical transparency and having a higher refractive index than the first translucent material 11 is deposited so as cover the entire area of the first translucent material 11, thereby embedding the concavities 13. It is possible for second translucent material 12 may be formed using, for example, a CVD method. Because the second translucent material 12 is formed so as to be deposited on the upper surface of the first translucent material 11, the surface of the second translucent material 12 has an uneven shape that reflects the unevenness caused by the concavities 13 of the first translucent material 11. Here, after the second translucent material 12 is deposited, the film is subjected to a planarizing process. In the planarizing process, for example, the upper surface of the second translucent material 12 is planarized by polishing and removing parts of the upper layer of the second translucent material 12 in which unevenness is formed using a chemical mechanical polishing (CMP) process, or the like. As a result of subjecting the second translucent material 12 to the planarizing process, as shown in FIG. 7B, the upper surface of the second translucent material 12 is planarized, and the microlens array 10 is completed.

The subsequent steps are not shown in detail in the drawings, and will be described with reference to FIG. 3. Next, the counter substrate 30 is obtained by forming, in order, an optical path length-adjusting layer 31, a light blocking layer 32, a protective layer 33, a common electrode 34, and an alignment film 35 on the microlens array 10 using a known technique. The element substrate 20 is obtained by forming, in order, a light blocking layer 22, an insulating layer 23, a TFT 24, an insulating layer 25, a light blocking layer 26, an insulating layer 27, a pixel electrode 28, and an alignment film 29 on a substrate 21.

Next, a thermosetting or photocurable adhesive is arranged as a seal material 42 (refer to FIG. 1) and cured between the element substrate 20 and the counter substrate 30. In so doing, the element substrate 20 and the counter substrate 30 are bonded, thereby completing the liquid crystal device 1.

Electronic Device

Figure 8:
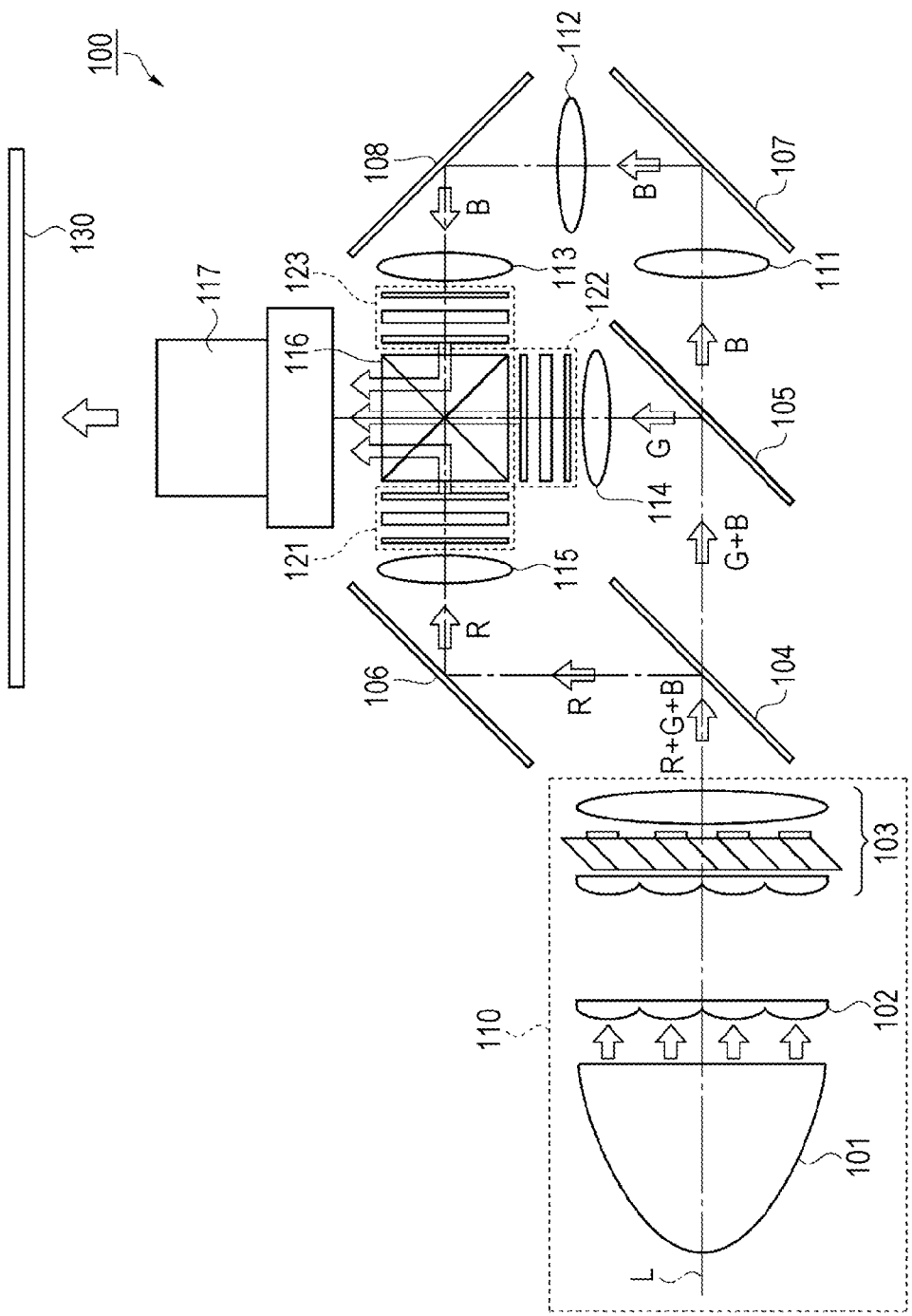
FIG. 8 is a schematic diagram showing a configuration of a projector as an electronic apparatus according to Embodiment 1.

Next, the electronic apparatus will be described with reference to FIG. 8. FIG. 8 is a schematic diagram showing a configuration of a projector as an electronic apparatus according to Embodiment 1.

As shown in FIG. 8, the projector (projection-type display device) 100 as the electronic apparatus according to Embodiment 1 includes a polarized illumination device 110, two dichroic mirrors 104 and 105, three reflection mirrors 106, 107, and 108, 5 relay lenses 111, 112, 113, 114, and 115, three liquid crystal light valves 121, 122, and 123, a cross dichroic prism 116, and a projection lens 117.

The polarized illumination device 110, for example, includes a lamp unit 101 as a light source formed from a white light source, such as an ultrahigh pressure mercury lamp or a halogen lamp, an integrator lens 102, and a polarization conversion element 103. The lamp unit 101, the integrator lens 102, and the polarization conversion element 103 are arranged along the system optical axis L.

The dichroic mirror 104 reflects red light (R), and allows green light (G) and blue light (B) from among the polarized luminous fluxes emitted from the polarized illumination device 110 to pass through. Another dichroic mirror 105 reflects green light (G) passing through the dichroic mirror 104, and allows blue light (B) to pass through.

The red light (R) reflected by the dichroic mirror 104 is incident on the liquid crystal light valve 121 through the relay lens 115 after being reflected by the reflection mirror 106. The green light (G) reflected by the dichroic mirror 105 is incident on the liquid crystal light valve 122 through the relay lens 114. The blue light (B) passing through the dichroic mirror 105 is incident on the liquid crystal valve 123 through a light guiding system configured by three relay lenses 111, 112, and 113 and two reflection mirrors 107 and 108.

The transmissive-type liquid crystal light valves 121, 122, and 123 as light modulating elements are arranged opposite one another with respect to the incident face for each colored light of the cross dichroic prism 116. The colored light incident on the liquid crystal light valves 121, 122, and 123 is modulated based on video information (video signal) and emitted towards the cross dichroic prism 116.

The cross dichroic prism 116 is configured by bonding four right-angle prisms, and formed in a cross-shape by a dielectric multilayer film that reflects red light and a dielectric multilayer film that reflects blue light are formed in a cross-shape on the inner surface thereof. Three colors of light are synthesized by these dielectric multilayer films, and light showing a color image is synthesized. The synthesized light is projected on a screen 130 by a projection lens 117 that is a projection optical system, and the image is enlarged and displayed.

The liquid crystal light valve 121 is applied to the liquid crystal device 1 described above. The liquid crystal light valve 121 is arranged by being placed in the gap between a pair of polarization elements arranged in a cross Nicol arrangement in the incident side and the emission side of the colored light. The same applies to other liquid crystal light valves 122 and 123.

According to the configuration of a projector 100 according to Embodiment 1, since the liquid crystal device 1 is included in which the spread angle of light due to interference of the diffraction light caused by the microlenses ML and pixels P able to efficiently utilize incident colored light is suppressed to be small, it is possible to provide a high quality, bright projector 100, even if the plurality of pixels P is arranged with high precision.

The invention is not limited to the embodiments described above, and various modifications, improvements, and the like can be added to the above-described embodiments. Modification examples are shown below.

MODIFICATION EXAMPLE 1

Form with Locally Broken Symmetry

Figure 9:
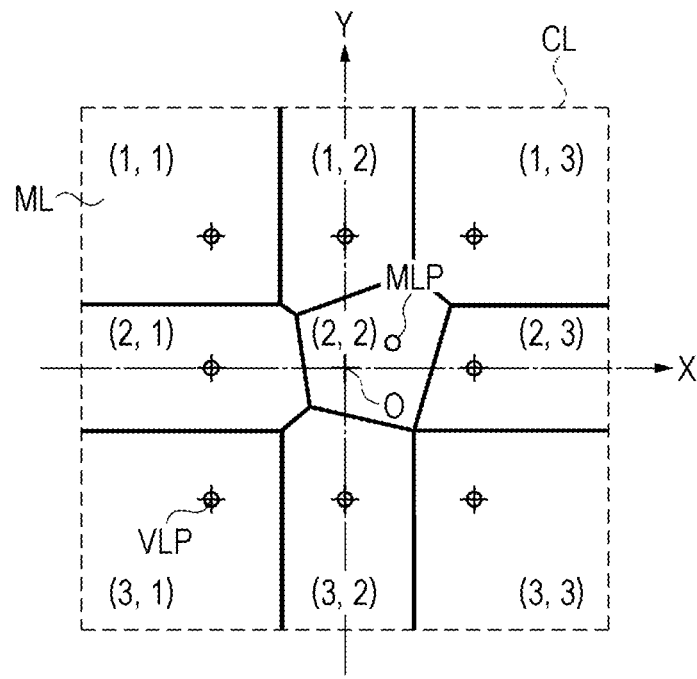
FIG. 9 is a diagram describing an example of a microlens array cell according to Modification Example 1.

FIG. 9 is a diagram describing an example of the cell of microlens array according to Modification Example 1. Next, the microlens array 10 according to Modification Example 1 will be described with reference to FIG. 9. The same constituent parts as Embodiment 1 are given the same reference symbols and overlapping description will not be made.

The microlens array 10 of the modification example shown in FIG. 9, the shapes of the microlenses ML that configure the cell CL are different. Otherwise, the configuration is the same as Embodiment 1. In Embodiment 1 shown in FIG. 5B, although the symmetry of the microlens ML shapes in the cell CL is completely broken, and the microlens peaks MLP are disorderly arranged, the symmetry of the shapes of the microlenses ML may be partially broken, as shown in the modification example. For example, as shown in FIG. 9, diffraction caused by regularity of the microlenses ML is suppressed, even if the symmetry is broken in at least one microlens ML of the P microlenses ML. In FIG. 9, the symmetry of the (2,2) microlens ML is broken. That is, the microlens peak MLP of the (2,2) microlens ML is shifted from the virtual lattice point VLP. As a result, the translational symmetry, the rotational symmetry, and the mirror inverse symmetry are partially broken, and the diffraction caused by regularity of the microlens ML is suppressed by the amount of the break.

MODIFICATION EXAMPLE 2

Form with Different Virtual Lattice Points

Figure 10:
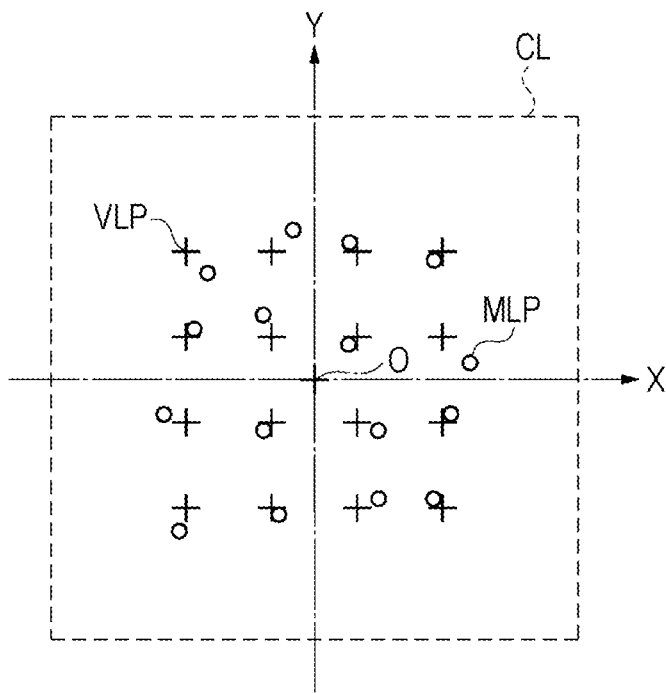
FIG. 10 is a diagram describing an example of the microlens array cell according to Modification Example 2.

FIG. 10 is a diagram describing an example of a cell of a microlens array according to Modification Example 2. Next, the microlens array 10 according to Modification Example 2 will be described with reference to FIG. 10. The same constituent parts as Embodiment 1 are given the same reference symbols and overlapping description will not be made.

In the microlens array 10 of the modification example shown in FIG. 10, the virtual lattice points VLP of the microlenses ML that configure the cell CL are different. Otherwise, the configuration is the same as Embodiment 1. In Embodiment 1 shown in FIG. 5B, the virtual lattice point VLP is provided at the intersection point at which the cells CL are evenly divided. The virtual lattice point VLP is not limited thereto, and any arrangement may be used, if it has any symmetry. In FIG. 10, the virtual lattice points VLP are gathered in the center of the cell CL, and have translational symmetry, rotational symmetry and mirror inverse symmetry. The microlens peaks MLP may be shifted with respect to the virtual lattice points VLP, and the microlenses ML may be disorderly arranged.

MODIFICATION EXAMPLE 3

Form with Different Unit Cell Groups

Figure 11:
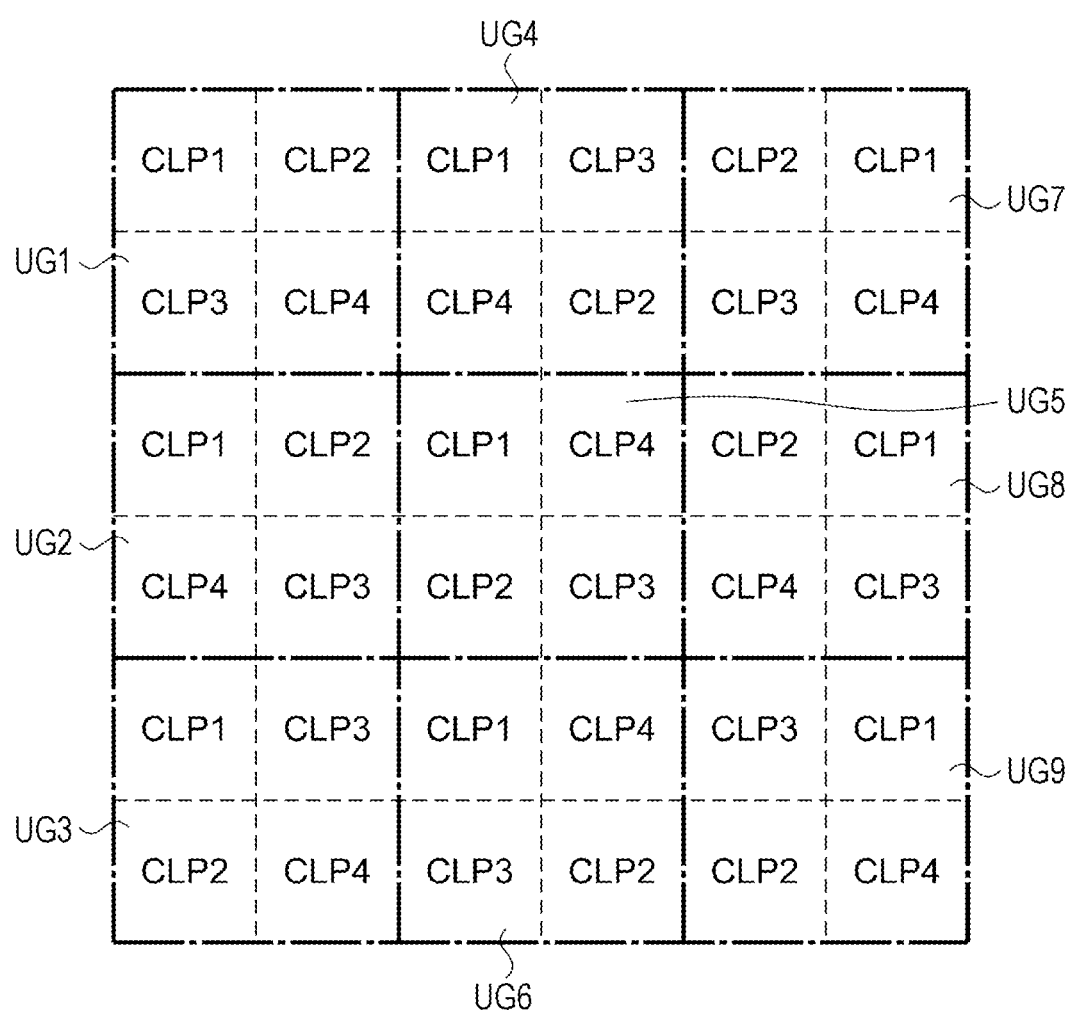
FIG. 11 is a diagram describing an example of the microlens array according to Modification Example 3.

FIG. 11 is a diagram describing an example of a microlens array according to Modification Example 3. Next, the microlens array 10 according to Modification Example 3 will be described with reference to FIG. 11. The same constituent parts as Embodiment 1 are given the same reference symbols and overlapping description will not be made.

In the microlens array 10 of the modification example shown in FIG. 11, the unit cell groups UG that configure the microlens array 10 are different. Otherwise, the configuration is the same as Embodiment 1. In the microlens array 10 of Embodiment 1 shown in FIG. 6, the unit cell group UG is configured by nine different cells CL, and the unit cell group UG is repeated. The configuration of the unit cell group UG is not limited thereto, and various forms are possible. As shown in FIG. 11, although the unit cell group UG includes n-squared different cells CL, the arrangement of these cells CL in the unit cell group UG may be changed. In the modification example, a plurality of types of unit cell group UG is prepared, and the arrangement of the cells CL is changed for each unit cell group UG. For example, as shown in FIG. 11, four different types of cell CL from the cell lens pattern CLP1 to the cell lens pattern CLP4 are prepared, and a plurality of types of unit cell group UG in which the arrangement of the four types of cell CL are changed is created. In the example in FIG. 11, nine types of unit cell group UG from a first unit cell group UG to a ninth unit cell group UG are created, and the arrangement of the four different types of cell CL in each unit cell group UG is changed. In this way, the microlens array 10 may be configured using a plurality of types of unit cell group UG.

The entire disclosure of Japanese Patent Application No. 2014-002194, filed Jan. 9, 2014 is expressly incorporated by reference herein.

What is claimed is:

1. A microlens array that includes a first lens, a second lens and a third lens arranged in a cell,
wherein:
the first lens and the second lens adjacent to each other are arranged neighboring in a first direction,
the first lens and the third lens are arranged neighboring in a second direction substantially orthogonal to the first direction, and
a gap between an apex of the first lens and an apex of the second lens is different to a gap between the apex of the first lens and an apex of the third lens.

2. An electro-optical device, comprising:
the microlens array according to claim 1.

3. An electronic apparatus, comprising:
the electro-optical device according to claim 2.

4. A microlens array that includes a first lens, a second lens and a third lens arranged in a cell,
wherein:
the first lens and the second lens are arranged neighboring in a first direction,
the first lens and the third lens adjacent to each other are arranged neighboring in a second direction substantially orthogonal to the first direction, and
an inner product of a vector that connects an apex of the first lens and an apex of the second lens and a vector that connects the apex of the first lens and an apex of the third lens is a value different to 0.

5. An electro-optical device, comprising:
the microlens array according to claim 4.

6. An electronic apparatus, comprising:
the electro-optical device according to claim 5.

7. A microlens array including P lenses (where P is an integer of 2 or more) arranged in a cell,
wherein:
a first lens and a second lens adjacent to each other are arranged neighboring in a first direction,
the first lens and a third lens adjacent to each other are arranged neighboring in a second direction substantially orthogonal to the first direction,
the second lens and a fourth lens adjacent to each other are arranged neighboring in the second direction,
the third lens and the fourth lens adjacent to each other are arranged neighboring in the first direction, and
apexes of the P lenses are arranged such that symmetry is at least partially broken, when viewed in plan view.

8. The microlens array according to claim 7,
wherein the apexes of the P lenses are disorderly arranged in the cell, when viewed in plan view.

9. An electro-optical device, comprising:
the microlens array according to claim 8.

10. An electronic apparatus, comprising:
the electro-optical device according to claim 9.

11. An electro-optical device, comprising:
the microlens array according to claim 7.

12. An electronic apparatus, comprising:
the electro-optical device according to claim 11.

13. A method for manufacturing a microlens array, comprising:
forming a first translucent material on a substrate;
forming a mask layer having a first opening portion, a second opening portion, and a third opening portion on the first translucent material;
forming a concavity in the first translucent material by subjecting the first translucent material to isotropic etching via the mask layer; and
embedding the concavity in a second translucent material with a refractive index different to the refractive index of the first translucent material,
wherein:
the first opening portion and the second opening portion adjacent to each other are arranged neighboring in a first direction,
the first opening portion and the third opening portion adjacent to each other are arranged neighboring in a second direction substantially orthogonal to the first direction, and
a gap between a center position of the first opening portion and a center position of the second opening portion is different to a gap between the center position of the first opening portion and a center position of the third opening portion.

14. An electro-optical device, comprising:
a microlens array manufactured by the method of manufacturing a microlens array according to claim 13.

15. A method for manufacturing a microlens array, comprising:
forming a first translucent material on a substrate;
forming a mask layer having a first opening portion, a second opening portion, and a third opening portion on the first translucent material;
forming a concavity in the first translucent material by subjecting the first translucent material to isotropic etching via the mask layer; and
embedding the concavity in a second translucent material with a refractive index different to the refractive index of the first translucent material,
wherein:
the first opening portion and the second opening portion are arranged neighboring in a first direction,
the first opening portion and the third opening portion adjacent to each other are arranged neighboring in a second direction substantially orthogonal to the first direction, and
an inner product of a vector connecting a center position adjacent to each other of the first opening portion and a center position of the second opening portion and a vector connecting the center position of the first opening portion and a center position of the third opening portion is a value different to 0.

16. An electro-optical device, comprising:
a microlens array manufactured by the method of manufacturing a microlens array according to claim 15.

17. A method for manufacturing a microlens array, comprising:
forming a first translucent material on a substrate;
forming a mask layer having P opening portions (P is an integer of 4 or more) in a unit area on the first translucent material;
forming a concavity in the first translucent material by subjecting the first translucent material to isotropic etching via the mask layer; and
embedding the concavity in a second translucent material with a refractive index different to the refractive index of the first translucent material,
wherein the P opening portions are arranged such that symmetry is at least partially broken, when viewed in plan view.

18. The method for manufacturing a microlens array according to claim 17,
wherein the P opening portions are disorderly arranged in a unit area, when viewed in plan view.

19. An electro-optical device, comprising:
a microlens array manufactured by the method of manufacturing a microlens array according to claim 18.

20. An electro-optical device, comprising:
a microlens array manufactured by the method of manufacturing a microlens array according to claim 17.

* * * * *